US012603424B2

(12) United States Patent
Theofanopoulos et al.

(10) Patent No.: US 12,603,424 B2
(45) Date of Patent: Apr. 14, 2026

(54) RADIO-FREQUENCY TRANSMISSION LINE STRUCTURES

(71) Applicant: Apple Inc., Cupertino, CA (US)

(72) Inventors: Panagiotis Theofanopoulos, Cupertino, CA (US); David Garrido Lopez, San Jose, CA (US); Nicholas A Renda, San Jose, CA (US); Le Li, Saratoga, CA (US); Xiangyu Wang, Sunnyvale, CA (US); Emily Sheng, Cupertino, CA (US); Jason Bakhshi, San Francisco, CA (US); Harish Rajagopalan, San Jose, CA (US); Forhad Hasnat, Milpitas, CA (US); Subramanian Ramalingam, San Jose, CA (US); Erik A Uttermann, San Francisco, CA (US); Rodney A Gomez Angulo, Santa Clara, CA (US); Ozgur Isik, San Jose, CA (US)

(73) Assignee: Apple Inc., Cupertino, CA (US)

( * ) Notice: Subject to any disclaimer, the term of this patent is extended or adjusted under 35 U.S.C. 154(b) by 226 days.

(21) Appl. No.: 18/167,735

(22) Filed: Feb. 10, 2023

(65) Prior Publication Data

US 2024/0113425 A1 Apr. 4, 2024

Related U.S. Application Data

(60) Provisional application No. 63/412,806, filed on Oct. 3, 2022.

(51) Int. Cl.
*H01Q 1/50* (2006.01)
*H01Q 1/24* (2006.01)
(Continued)

(52) U.S. Cl.
CPC ............... *H01Q 1/50* (2013.01); *H01Q 1/243* (2013.01); *H01Q 1/48* (2013.01); *H01Q 13/106* (2013.01); *H03H 7/38* (2013.01)

(58) Field of Classification Search
CPC ............ H01Q 1/50; H01Q 1/243; H01Q 1/48; H01Q 13/106; H01Q 13/10; H03H 7/38
See application file for complete search history.

(56) References Cited

U.S. PATENT DOCUMENTS 6,906,677 B2 6/2005 Yamamoto et al.
7,557,761 B2 7/2009 Iwai et al.
(Continued)

FOREIGN PATENT DOCUMENTS

JP 2010226550 A * 10/2010

*Primary Examiner* — Dimary S Lopez Cruz
*Assistant Examiner* — Austin M Back
(74) *Attorney, Agent, or Firm* — Treyz Law Group, P.C.; Tianyi He

(57) ABSTRACT

An electronic device may include an antenna and a coaxial cable coupled to the antenna. The coaxial cable may have a signal conductor coupled to an antenna resonating element of the antenna and a ground conductor coupled to an antenna ground of the antenna. The ground conductor may include an ungrounded segment that is separated from the antenna ground by a gap. A capacitive coupling between the ground conductor in the ungrounded segment and the antenna ground via the gap may form an impedance matching component for the coaxial cable. A dielectric retention layer may overlap the coaxial cable and hold the coaxial cable in place relative to the antenna ground to maintain the gap.

20 Claims, 9 Drawing Sheets

(51) Int. Cl.
  *H01Q 1/48*      (2006.01)
  *H01Q 13/10*     (2006.01)
  *H03H 7/38*      (2006.01)

(56)            References Cited

U.S. PATENT DOCUMENTS

| | | | |
|---|---|---|---|
| 7,903,036 | B2 | 3/2011 | Takaki et al. |
| 8,217,845 | B2 | 7/2012 | Kubota et al. |
| 8,907,850 | B2 * | 12/2014 | Schlub .................. H01Q 21/29 |
| | | | 343/702 |
| 9,287,627 | B2 | 3/2016 | Jarvis et al. |
| 10,476,167 | B2 | 11/2019 | Ayala Vazquez et al. |
| 11,205,834 | B2 * | 12/2021 | Ayala Vazquez ...... H01Q 1/243 |
| 2013/0009828 | A1 * | 1/2013 | Pascolini ............... H01Q 13/10 |
| | | | 343/702 |
| 2014/0176391 | A1 * | 6/2014 | Tayama .................. H01Q 1/50 |
| | | | 29/601 |
| 2017/0353024 | A1 * | 12/2017 | Varale ................. H01Q 1/1221 |

* cited by examiner

RADIO-FREQUENCY TRANSMISSION LINE STRUCTURES

This application claims the benefit of U.S. provisional patent application No. 63/412,806, filed on Oct. 3, 2022, which is hereby incorporated by reference herein in its entirety.

BACKGROUND

This relates generally to electronic devices and, more particularly, to electronic devices with wireless communications capabilities.

Electronic devices such as portable computers and cellular telephones are often provided with wireless communications capabilities. To satisfy consumer demand for small form factor wireless devices, manufacturers are continually striving to implement wireless communications circuitry such as antenna components using compact structures. At the same time, there is a desire for wireless devices to cover a growing number of communications bands.

Because antennas have the potential to interfere with each other and with components in a wireless device, care must be taken when incorporating antennas into an electronic device. Moreover, care must be taken to ensure that the antennas and wireless circuitry in a device are able to exhibit satisfactory performance over a range of operating frequencies and with satisfactory efficiency bandwidth.

SUMMARY

An electronic device may include wireless circuitry. The wireless circuitry may include an antenna and a radio-frequency transmission line coupling radio-frequency transceiver circuitry to the antenna. The radio-frequency transmission line may be a coaxial cable having a signal conductor coupled to an antenna resonating element of the antenna at a positive antenna feed terminal and a ground conductor coupled to an antenna ground of the antenna at a ground antenna feed terminal. The ground conductor may include an ungrounded segment that is separated from an antenna ground by a gap. A capacitive coupling between the ground conductor in the ungrounded segment and the antenna ground via the gap may form an impedance matching component for the coaxial cable.

To consistently maintain the gap, a retention layer may hold the coaxial cable in place relative to the antenna ground. The retention layer may include a groove for accommodating the coaxial cable and may be attached to the antenna ground on opposing sides of the groove. The retention layer may be formed from a material that does not impact the radio-frequency operations of the wireless circuitry.

DETAILED DESCRIPTION

Figure 1:
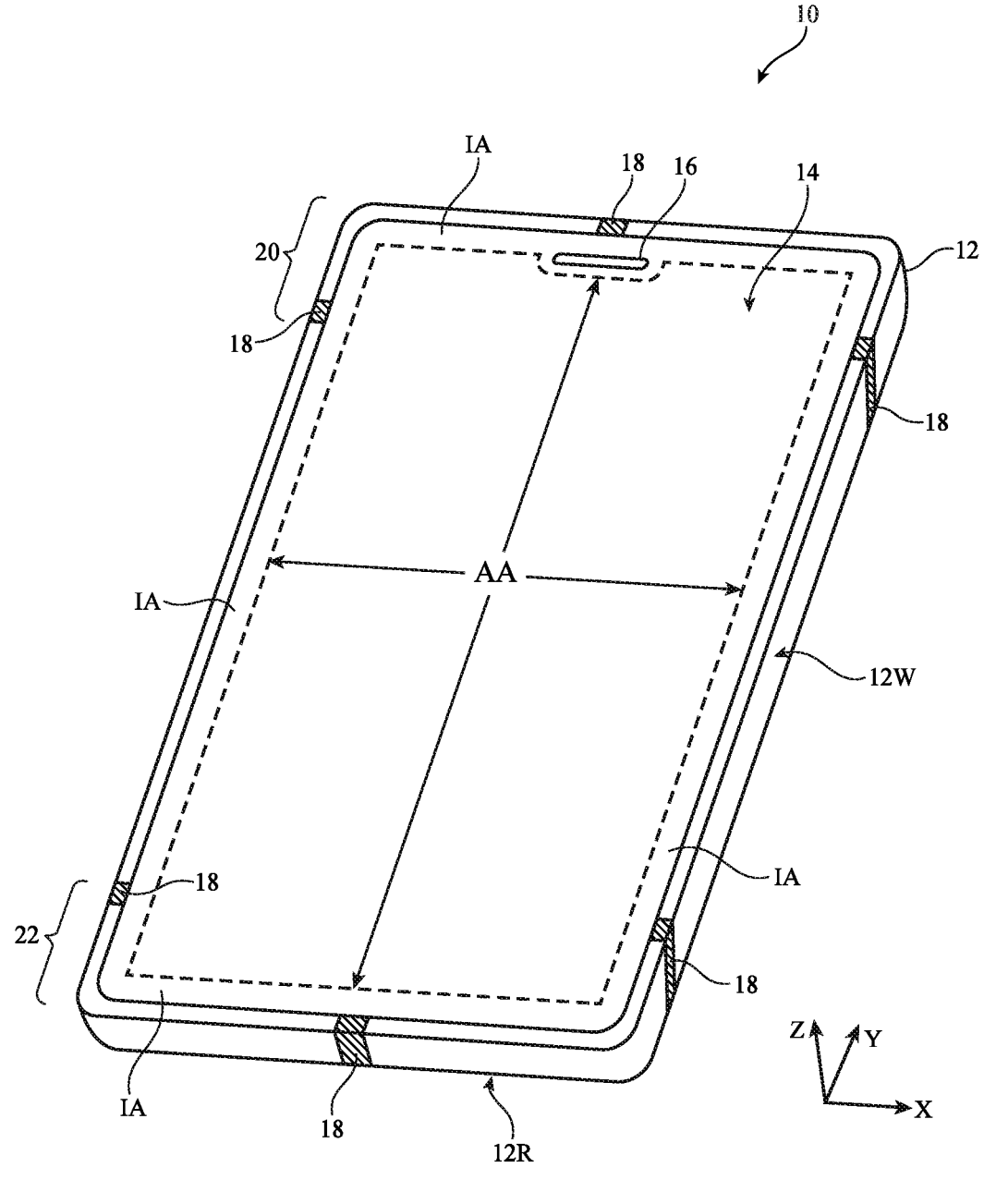
FIG. 1 is a perspective view of an illustrative electronic device in accordance with some embodiments.

An electronic device such as electronic device 10 of FIG. 1 may be provided with wireless circuitry that includes antennas. The antennas may be used to transmit and/or receive wireless radio-frequency signals.

Device 10 may be a portable electronic device or other suitable electronic device. For example, device 10 may be a laptop computer, a tablet computer, a somewhat smaller device such as a wrist-watch device, pendant device, headphone device, earpiece device, headset device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic (e.g., a dielectric cover layer). Housing 12 may also have shallow grooves that do not pass entirely through housing 12. The slots and grooves may be filled with plastic or other dielectric materials. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). In other words, device 10 may have a length (e.g., measured parallel to the Y-axis), a width that is less than the length (e.g., measured parallel to the X-axis), and a height (e.g., measured parallel to the Z-axis) that is less than the width. Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed of a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, alloys, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating/cover layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region such as a notch that extends into active area AA. Active area AA may, for example, be defined by the lateral area of a display module for display 14 (e.g., a display module that includes pixel circuitry, touch sensor circuitry, etc.). The display module may have a recess or notch in upper region 20 of device 10 that is free from active display circuitry (i.e., that forms the notch of inactive area IA). The notch may be a substantially rectangular region that is surrounded (defined) on three sides by active area AA and on a fourth side by peripheral conductive housing structures 12W.

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 in the notch or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a conductive support plate or backplate) that spans the walls of housing 12 (e.g., a substantially rectangular sheet formed from one or more metal parts that is welded or otherwise connected between opposing sides of peripheral conductive housing structures 12W). The conductive support plate may form an exterior rear surface of device 10 or may be covered by a dielectric cover layer such as a thin cosmetic layer, protective coating, and/or other coatings that may include dielectric materials such as glass, ceramic, plastic, or other structures that form the exterior surfaces of device 10 and/or serve to hide the conductive support plate from view of the user (e.g., the conductive support plate may form part of rear housing wall 12R). Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20. Region 22 may sometimes be referred to herein as lower region 22 or lower end 22 of device 10. Region 20 may sometimes be referred to herein as upper region 20 or upper end 20 of device 10.

In general, device 10 may include any suitable number of antennas (e.g., one or more, two or more, three or more, four or more, etc.). The antennas in device 10 may be located at opposing first and second ends of an elongated device housing (e.g., at lower region 22 and/or upper region 20 of device 10 of FIG. 1), along one or more edges of a device housing, in the center of a device housing, in other suitable locations, or in one or more of these locations. The arrangement of FIG. 1 is merely illustrative.

Portions of peripheral conductive housing structures 12W may be provided with peripheral gap structures. For example, peripheral conductive housing structures 12W may be provided with one or more dielectric-filled gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14. In order to provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas. An upper antenna may, for example, be formed in upper region 20 of device 10. A lower antenna may, for example, be formed in lower region 22 of device 10. Additional antennas may be formed along the edges of housing 12 extending between regions 20 and 22 if desired. An example in which device 10 includes three or four upper antennas and five lower antennas is described herein as an example. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is merely illustrative. If desired, housing 12 may have other shapes (e.g., a square shape, cylindrical shape, spherical shape, combinations of these and/or different shapes, etc.).

Figure 2:
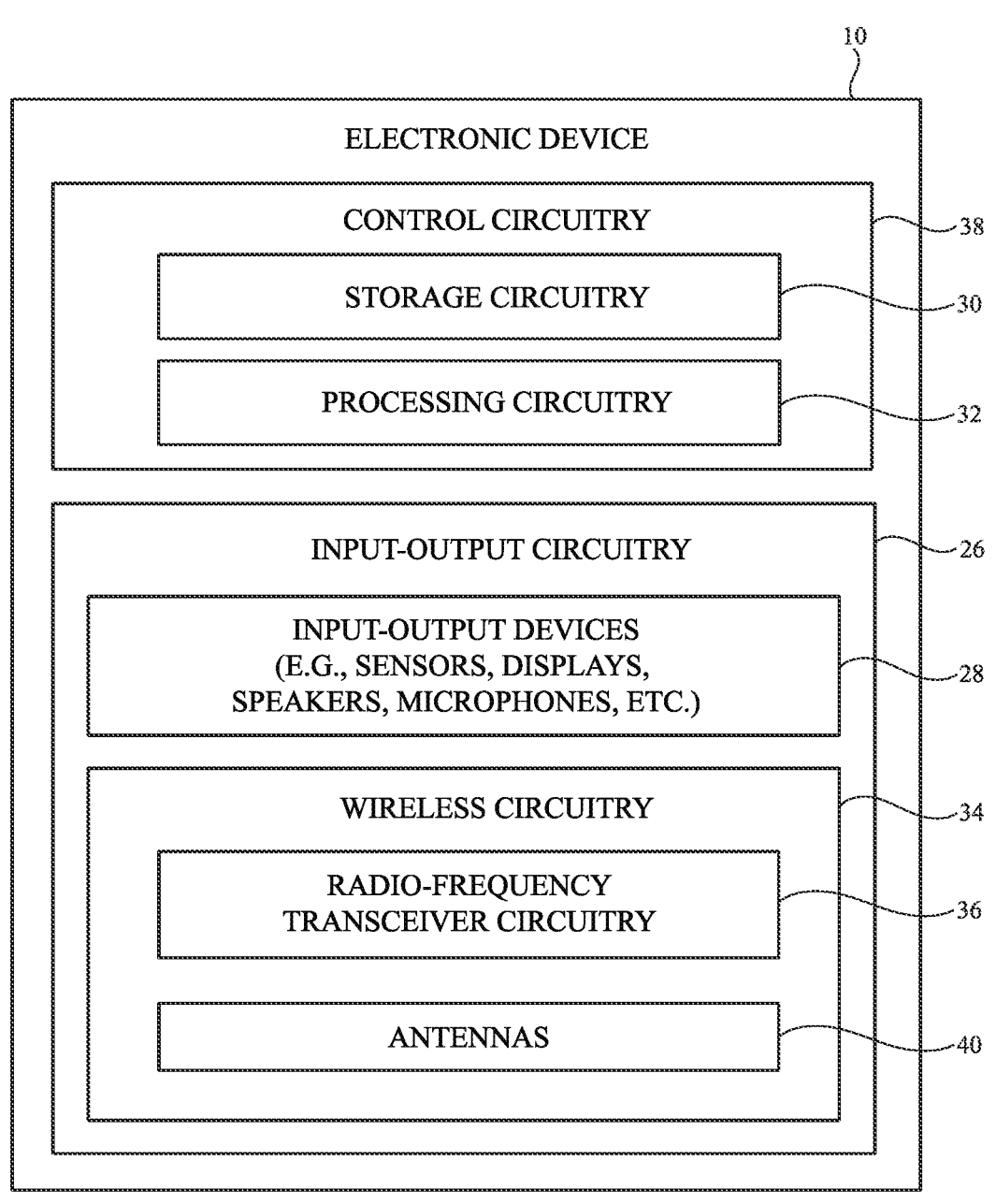
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 38. Control circuitry 38 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 38 may include processing circuitry such as processing circuitry 32. Processing circuitry 32 may be used to control the operation of device 10. Processing circuitry 32 may include on one or more microprocessors, microcontrollers, digital signal processors, host processors, baseband processor integrated circuits, application specific integrated circuits, graphics processing units, central processing units (CPUs), etc. Control circuitry 38 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 38 may be used to run software on device 10 such as internet browsing applications, voice-over-internet-protocol (VOIP) telephone call applications, email applications, media playback applications, operating system functions, etc. To support interactions with external equipment, control circuitry 38 may be used in implementing communications protocols. Communications protocols that may be implemented using control circuitry 38 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 26. Input-output circuitry 26 may include input-output devices 28. Input-output devices 28 may be used to allow data to be supplied to device 10 and to allow data to be provided from device 10 to external devices. Input-output devices 28 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 26 may include wireless circuitry such as wireless circuitry 34 for wirelessly conveying radio-frequency signals. While control circuitry 38 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 38 (e.g., portions of control circuitry 38 may be implemented on wireless circuitry 34). As an example, control circuitry 38 may include baseband processor circuitry or other control components that form a part of wireless circuitry 34.

Wireless circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless circuitry 34 may include radio-frequency transceiver circuitry 36 for handling transmission and/or reception of radio-frequency signals within corresponding frequency bands at radio frequencies (sometimes referred to herein as communications bands or simply as "bands"). The frequency bands handled by radio-frequency transceiver circuitry 36 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz, or other cellular communications bands between about 600 MHz and about 5000 MHz), 3G bands, 4G LTE bands, 3GPP 5G New Radio Frequency Range 1 (FR1) bands below 10 GHz, 3GPP 5G New Radio (NR) Frequency Range 2 (FR2) bands between 20 and 60 GHz, other centimeter or millimeter wave frequency bands between 10-300 GHz, near-field communications frequency bands (e.g., at 13.56 MHz), satellite navigation frequency bands such as the Global Positioning System (GPS) L1 band (e.g., at 1575 MHz), L2 band (e.g., at 1228 MHz), L3 band (e.g., at 1381 MHz), L4 band (e.g., at 1380 MHz), and/or L5 band (e.g., at 1176 MHz), a Global Navigation Satellite System (GLONASS) band, a BeiDou Navigation Satellite System (BDS) band, ultra-wideband (UWB) frequency bands that operate under the IEEE 802.15.4 protocol and/or other ultra-wideband communications protocols (e.g., a first UWB communications band at 6.5 GHz and/or a second UWB communications band at 8.0 GHz), communications bands under the family of 3GPP wireless communications standards, communications bands under the IEEE 802.XX family of standards, satellite communications bands such as an L-band, S-band (e.g., from 2-4 GHz), C-band (e.g., from 4-8 GHz), X-band, Ku-band (e.g., from 12-18 GHz), Ka-band (e.g., from 26-40 GHz), etc., industrial, scientific, and medical (ISM) bands such as an ISM band between around 900 MHz and 950 MHz or other ISM bands below or above 1 GHz, one or more unlicensed bands, one or more bands reserved for emergency and/or public services, and/or any other desired frequency bands of interest. Wireless circuitry 34 may also be used to perform spatial ranging operations if desired.

The UWB communications handled by radio-frequency transceiver circuitry 36 may be based on an impulse radio signaling scheme that uses band-limited data pulses. Radio-frequency signals in the UWB frequency band may have any desired bandwidths such as bandwidths between 499 MHz and 1331 MHz, bandwidths greater than 500 MHz, etc. The presence of lower frequencies in the baseband may sometimes allow ultra-wideband signals to penetrate through objects such as walls. In an IEEE 802.15.4 system, for example, a pair of electronic devices may exchange wireless time stamped messages. Time stamps in the messages may be analyzed to determine the time of flight of the messages and thereby determine the distance (range) between the devices and/or an angle between the devices (e.g., an angle of arrival of incoming radio-frequency signals).

Radio-frequency transceiver circuitry 36 may include respective transceivers (e.g., transceiver integrated circuits or chips) that handle each of these frequency bands or any desired number of transceivers that handle two or more of these frequency bands. In scenarios where different transceivers are coupled to the same antenna, filter circuitry (e.g., duplexer circuitry, diplexer circuitry, low pass filter circuitry, high pass filter circuitry, band pass filter circuitry, band stop filter circuitry, etc.), switching circuitry, multiplexing circuitry, or any other desired circuitry may be used to isolate radio-frequency signals conveyed by each transceiver over the same antenna (e.g., filtering circuitry or multiplexing circuitry may be interposed on a radio-frequency transmission line shared by the transceivers). Radio-frequency transceiver circuitry 36 may include one or more integrated circuits (chips), integrated circuit packages (e.g., multiple integrated circuits mounted on a common printed circuit in a system-in-package device, one or more integrated circuits mounted on different substrates, etc.), power amplifier circuitry, up-conversion circuitry, down-conversion circuitry, low-noise input amplifiers, passive radio-frequency components, switching circuitry, transmission line structures, and other circuitry for handling radio-frequency signals and/or for converting signals between radio-frequencies, intermediate frequencies, and/or baseband frequencies.

In general, radio-frequency transceiver circuitry 36 may cover (handle) any desired frequency bands of interest. As shown in FIG. 2, wireless circuitry 34 may include antennas 40. Radio-frequency transceiver circuitry 36 may convey radio-frequency signals using one or more antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

Antennas 40 in wireless circuitry 34 may be formed using any suitable antenna types. For example, antennas 40 may include antennas with resonating elements that are formed from stacked patch antenna structures, loop antenna structures, patch antenna structures, inverted-F antenna structures, slot antenna structures, planar inverted-F antenna structures, waveguide structures, monopole antenna structures, dipole antenna structures, helical antenna structures, Yagi (Yagi-Uda) antenna structures, hybrids of these designs, etc. If desired, antennas 40 may include antennas with dielectric resonating elements such as dielectric resonator antennas. If desired, one or more of antennas 40 may be cavity-backed antennas. Two or more antennas 40 may be arranged in a phased antenna array if desired (e.g., for conveying centimeter and/or millimeter wave signals within a signal beam formed in a desired beam pointing direction that may be steered/adjusted over time). Different types of antennas may be used for different bands and combinations of bands.

Figure 3:
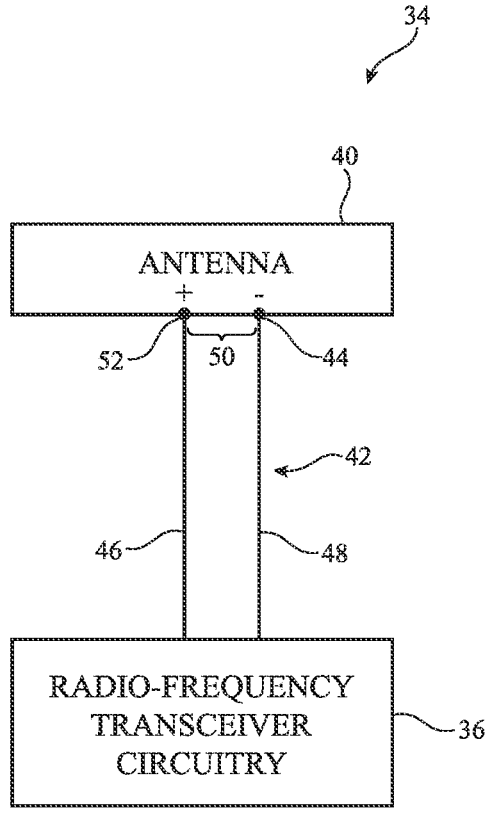
FIG. 3 is a schematic diagram of illustrative wireless circuitry in accordance with some embodiments.

FIG. 3 is a schematic diagram showing how a given antenna 40 may be fed by radio-frequency transceiver circuitry 36. As shown in FIG. 3, antenna 40 may have a corresponding antenna feed 50. Antenna 40 may include an antenna resonating (radiating) element and an antenna ground. Antenna feed 50 may include a positive antenna feed terminal 52 coupled to the antenna resonating element and a ground antenna feed terminal 44 coupled to the antenna ground.

Radio-frequency transceiver circuitry 36 may be coupled to antenna feed 50 using a radio-frequency transmission line path 42 (sometimes referred to herein as transmission line path 42). Transmission line path 42 may include a signal conductor such as signal conductor 46 (e.g., a positive signal conductor). Transmission line path 42 may include a ground conductor such as ground conductor 48. Ground conductor 48 may be coupled to ground antenna feed terminal 44 of antenna feed 50. Signal conductor 46 may be coupled to positive antenna feed terminal 52 of antenna feed 50.

Transmission line path 42 may include one or more radio-frequency transmission lines. The radio-frequency transmission line(s) in transmission line path 42 may include stripline transmission lines (sometimes referred to herein simply as striplines), coaxial cables, coaxial probes realized by metalized vias, microstrip transmission lines, edge-coupled microstrip transmission lines, edge-coupled stripline transmission lines, waveguide structures, combinations of these, etc. Multiple types of radio-frequency transmission line may be used to form transmission line path 42. Filter circuitry, switching circuitry, impedance matching circuitry, phase shifter circuitry, amplifier circuitry, and/or other circuitry may be interposed on transmission line path 42, if desired. One or more antenna tuning components for adjusting the frequency response of antenna 40 in one or more bands may be interposed on transmission line path 42 and/or may be integrated within antenna 40 (e.g., coupled between the antenna ground and the antenna resonating element of antenna 40, coupled between different portions of the antenna resonating element of antenna 40, etc.).

If desired, one or more of the radio-frequency transmission lines in transmission line path 42 may be integrated into ceramic substrates, rigid printed circuit boards, and/or flexible printed circuits. In one suitable arrangement, the radio-frequency transmission lines may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All the multiple layers of the laminated structures may be batch laminated together (e.g., in a single pressing process) without adhesive (e.g., as opposed to performing multiple pressing processes to laminate multiple layers together with adhesive).

Figure 4:
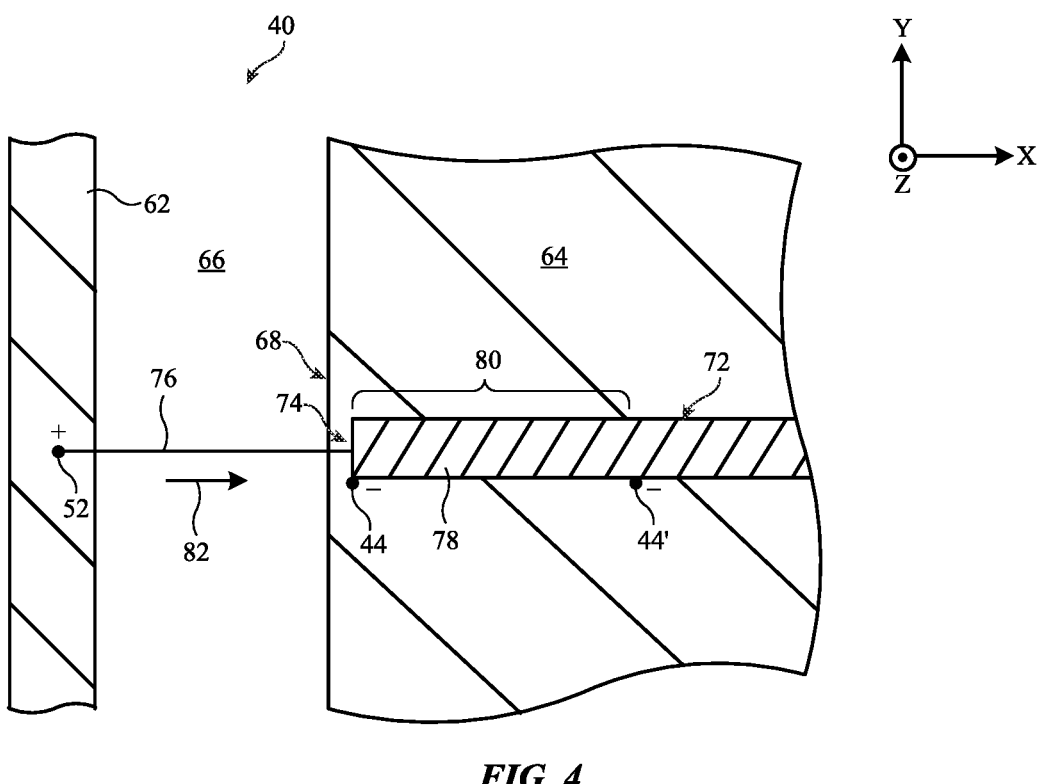
FIG. 4 is a plan view of wireless circuitry having an antenna coupled to an illustrative transmission line with an ungrounded section in accordance with some embodiments.

FIG. 4 shows illustrative antennas structures for an antenna 40 that may be coupled to a radio-frequency transmission line. As shown in FIG. 4, antenna 40 may include conductive structure 62 and an antenna ground such as antenna ground 64. Conductive structure 62 may be separated from antenna ground 64 by a dielectric-filled opening 66 (sometimes referred to herein as dielectric-filled opening 66, dielectric slot element 66, or simply slot element 66).

In some illustrative arrangements, conductive structure 62 may have dimensions (e.g., a length, a width, a height, a shape, etc.) that enable conductive structure 62 itself to radiate and convey radio-frequency signals at one or more desired frequencies (e.g., in one or more frequency bands) based on fundamental and/or harmonic modes. In these arrangements, conductive structure 62 may form the antenna resonating element (sometimes referred to as an antenna radiating element or antenna radiator) for antenna 40. As examples, conductive structure 62 may formed a patch antenna resonating element, a loop antenna resonating element, an inverted-F antenna resonating element, a planar inverted-F antenna resonating element, a monopole antenna resonating element, a dipole antenna resonating element, a helical antenna resonating element, a Yagi (Yagi-Uda) antenna resonating element, hybrids of these designs, etc. If desired, conductive structure 62 may be a dielectric resonating element instead of a conductive resonating element.

In other arrangements, slot element 66 surrounded on two or more sides by conductive structure 62 and/or antenna ground 64 may form a slot antenna resonating element for antenna 40. In these arrangements, slot element 66 may have dimensions (e.g., a perimeter, open end(s), closed end(s), etc.) that enable the conductive edges of conductive structure 62 and/or antenna ground 64 defining slot element 66 to radiate and convey radio-frequency signals at one or more desired frequencies (e.g., in one or more frequency bands) based on fundamental and/or harmonic modes. As examples, slot element 66 may be a closed slot (e.g., being surrounded or confined on all lateral sides by conductive material such as structure 62 and/or antenna ground 64), a slot with one or more open ends (e.g., having one or more sides unconfined by conductive material), a slot with a meandering shape with different segments extending in different directions, a slot with any combination of straight and curved (lateral) edges, etc. Configurations in which antenna 40 is a slot antenna in which slot element 66 serves as a slot antenna resonating element are sometimes described herein as an illustrative example.

Antenna 40 may be coupled to a radio-frequency transmission line such as coaxial cable 72. Coaxial cable 62 may include an inner conductor such as inner conductor 76 forming a positive signal conductor (e.g., conductor 46 in FIG. 3) and may include an outer conductor (sometimes referred to as an outer conductive shield) such as outer conductor 78 forming a ground conductor (e.g., conductor 48 in FIG. 3). Signal conductor 76 may be coupled to conductive structure 62 at positive antenna feed terminal 52. Ground conductor 78 may be coupled to antenna ground 64 at ground antenna feed terminal 44. While not illustrated in FIG. 4 in order to not unnecessarily obscure the embodiments of FIG. 4, an inner dielectric insulator may be included in coaxial cable 72 between signal conductor 76 and ground conductor 78 and an outer dielectric protective covering (e.g., plastic sheath) may be included in coaxial cable 72 to surround and protect ground conductor 78, thereby forming the exterior layer of coaxial cable 72. Each of these different functional layers in coaxial cable 72 may run along the same longitudinal axis.

The use of a coaxial cable as a transmission line for an antenna has a number of advantages such as enabling high signal bandwidth and exhibiting less signal loss (e.g., as compared with a transmission line formed from conductive traces on a printed circuit). However, the use of the coaxial cable to feed the antenna provides few (if any) ways for providing impedance matching to the antenna feed. The absence of antenna feed impedance matching can degrade performance of antenna (e.g., degrade antenna coverage for at least some frequencies). Whereas lumped components such as surface-mounted capacitors and inductors for impedance matching can be conveniently provided on the printed circuit when printed circuit traces form part of the transmission line, this approach may be not be feasible with a stand-alone coaxial cable.

To provide a way to perform antenna feed matching without separately introducing bulky lumped components, a coaxial cable may be provided with an ungrounded portion that serves as a matching component for the coaxial cable. FIG. 4 further illustrates how ground conductor 78 may be coupled to antenna ground 64 at ground antenna feed terminal 44' instead of at ground antenna feed terminal 44 (as an example). Whereas the grounding location of ground conductor 78 may typically be at or close to edge 68 of antenna ground 64 (e.g., to ensure the desired electric field distribution within and the desired current around the perimeter of a slot antenna resonating element such as slot element 66), moving this grounding location of ground conductor 78 along its length (e.g., along the length of coaxial cable 72) may help provide an impedance matching structure for coaxial cable 72.

As shown in FIG. 4, when ground conductor 78 is grounded at a location adjacent to feed terminal 44' (instead of feed terminal 44), ground conductor 78 may have an ungrounded segment or portion such as segment 80 between the grounding location and a distal end 74 of ground conductor 78 toward antenna 40 (e.g., toward positive antenna feed terminal 52). Segment 80 lacks any direct or active grounding connections to antenna ground 64. In other words, the grounding location at which ground conductor 78 is connected to feed terminal 44' is the closest grounding location to end 74 along the length of ground conductor 78.

Figure 5:
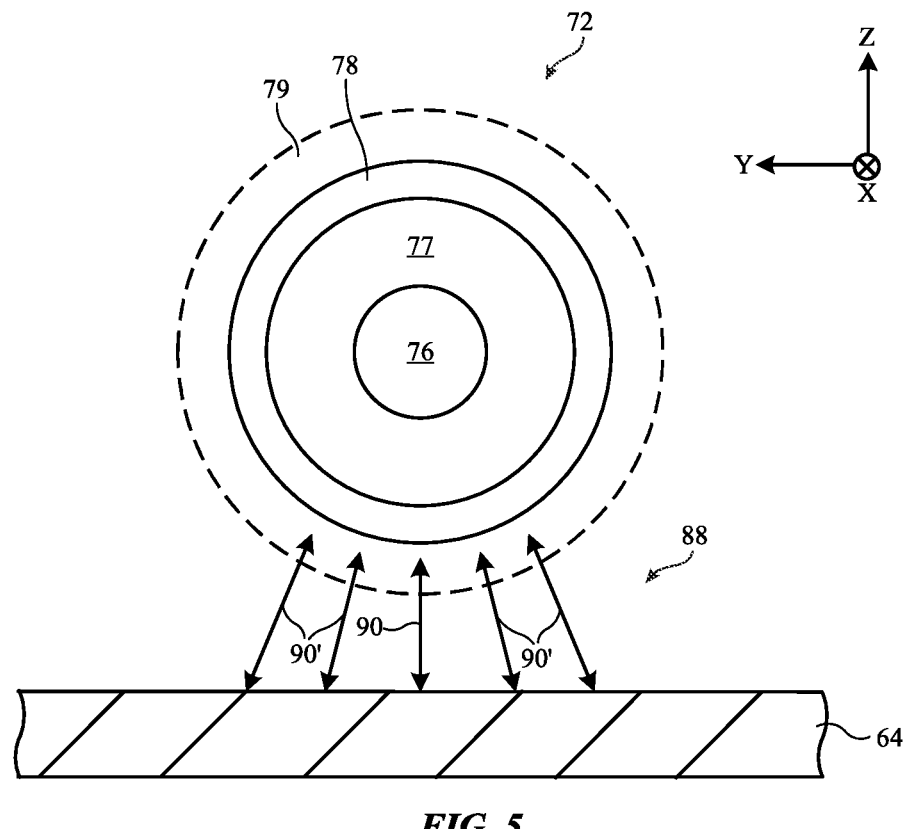
FIG. 5 is a cross-sectional side view of an illustrative transmission line of the type shown in FIG. 4 separated from an antenna ground by a dielectric gap in accordance with some embodiments.

FIG. 5 is an illustrative cross-sectional view of coaxial cable 72 taken at segment 80 along the y-z plane (FIG. 4) and as viewed in direction 82 (FIG. 4). As shown in FIG. 5, coaxial cable 72 may include outermost dielectric layer 79 (e.g., a protective plastic sheath), which surrounds outer ground conductor 78. Coaxial cable 72 may include inner signal conductor 76 surrounded by and separated from outer ground conductor 78 by inner dielectric insulator 77.

Coaxial cable 72, or more specifically, ground conductor 78 in segment 80 of coaxial cable 72 may be separated from antenna ground 64 by a gap such as gap 88. Across gap 88, distance 90 represents the smallest distance separating ground conductor 78 from antenna ground 64 (e.g., across respective locations on ground conductor 78 and antenna ground 64 closest to each other). Other varying distances 90' across gap 88 may also separate other locations on ground conductor 78 from corresponding locations on antenna ground 64. Gap 88 may have varying distances 90 and 90' due to ground conductor 78 having a circular profile while antenna ground 64 has a linear profile. The existence of gap 88 creates a non-zero separation (e.g., filled with dielectric material such as air, plastic, adhesive, outer sheath of coaxial cable, etc.) between the conductive structure of ground conductor 78 and the conductive structure of antenna ground 64, thereby providing a capacitance therebetween and forming a capacitor therefrom. Due to the varying distances of gap 88 between ground conductor 78 and antenna ground 64 that each contribute to the capacitance, this capacitance may sometimes be referred to herein as a distributed capacitance with the most dominant capacitance being contributed by the smallest distance 90 across gap 88.

While FIG. 5 shows a cross-sectional view of transmission line 72 across a particular cross-section of transmission line 72 at segment 80, gap 88 may be maintained across the entire length (as measured along the x-axis) of segment 80 on transmission line 72. In other words, segment 80 across its length may be separated from antenna ground 64 by a continuous gap 88. Configurations in which gap 88 has a uniform smallest distance 90 across at least some of the length of segment 80 are sometimes described herein as an illustrative example. If desired, distance 90 and/or distances 90' may be varied at various points across gap 88 along the length of segment 80 (e.g., in scenarios where antenna ground is includes steps, grooves, and other non-planar surface features overlapping segment 80).

Configured in the manner described in connection with FIGS. 4 and 5, ungrounded segment 80 of coaxial cable 72 in combination with the overlapping portion of antenna ground 64 may provide an impedance matching structure (e.g., a transmission line stub) even without introducing lumped elements (e.g., a surface-mounted capacitor). In particular, the capacitive coupling between ungrounded segment 80 of coaxial cable 72 and antenna ground 64 (in FIGS. 4 and 5) may effectively serve as a transmission line stub provided in a shunt configuration as illustrated in FIG. 6.

Figure 6:
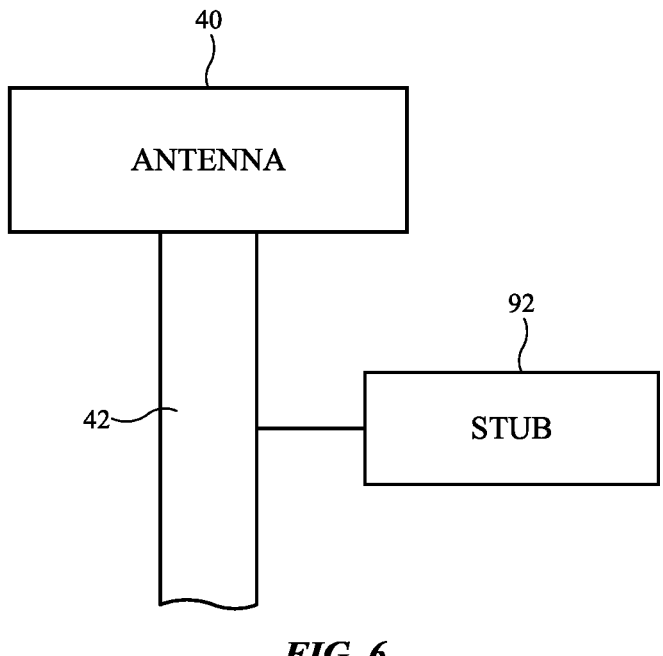
FIG. 6 is a schematic diagram of an illustrative transmission line tuning stub in accordance with some embodiments.

FIG. 6 is a functional block diagram of illustrative transmission line structures coupled to a transmission line stub. As shown in FIG. 6, transmission line 42 such as coaxial cable 72 may be coupled to antenna 40. Along the length of transmission line 42, stub 92 may be coupled to transmission line 42 in a shunt configuration. Stub 92 may be coupled to transmission line 42 at a location separated from antenna 40 by a desired distance.

The effects of providing a shunt transmission line stub 92 can be substantively achieved by using a capacitive coupling of segment 80 with antenna ground 64. Accordingly, this capacitive coupling may be configured to perform impedance matching of the coaxial cable transmission line to the antenna feed and antenna (e.g., for one or more frequencies in one or more frequency bands).

Stub 92 may be configured in different manners to provide the desired tuning or matching characteristics. When using the relative placement between segment 80 and antenna ground 64 to achieve a tuning or matching effect, the capacitance and therefore the tuning or matching characteristics can also be desirable controlled to achieve satisfactory impedance matching to the antenna feed and antenna (e.g., for one or more frequencies in one or more frequency bands).

In one illustrative arrangement, a minimum distance between coaxial cable 72 and antenna ground 64 (e.g., distance 90 in FIG. 5) may be greater than 0.01 mm, greater than 0.02 mm, greater than 0.05 mm, greater than 0.1 mm, greater than 1 mm, etc. and/or less than 2 mm, less than 1 mm, less than 0.5 mm, less than 0.2 mm, less than 0.1 mm, etc. In this illustrative arrangement, a length of the ungrounded segment of the ground conductor (e.g., length of segment 80) may be greater than 5 mm, greater than 6 mm, greater than 8 mm, greater than 10 mm, greater than 15 mm, etc. and/or less than 20 mm, less than 15 mm, less than 10 mm, less than 8 mm, etc. Configured in this illustrative arrangement, coaxial cable 72 may be configured to perform satisfactory impedance matching to the antenna feed for antenna 40 when conveying radio-frequency signals having one or more frequencies between 5 GHz and 6 GHz, as an example.

When incorporating coaxial cable 72 into an electronic device such as device 10 (FIGS. 1 and 2), the placement of coaxial cable 72 (e.g., the relative placement of segment 80 with respect to antenna ground 64) may critical to provide the matching component enabled by the capacitive coupling between segment 80 and antenna ground 64. The wireless circuitry may further include a retention mechanism that can control and maintain the gap between segment 80 and antenna ground 64 and therefore the desired capacitance therebetween (e.g., even after the device experiences impact and/or drop events).

Figure 7:
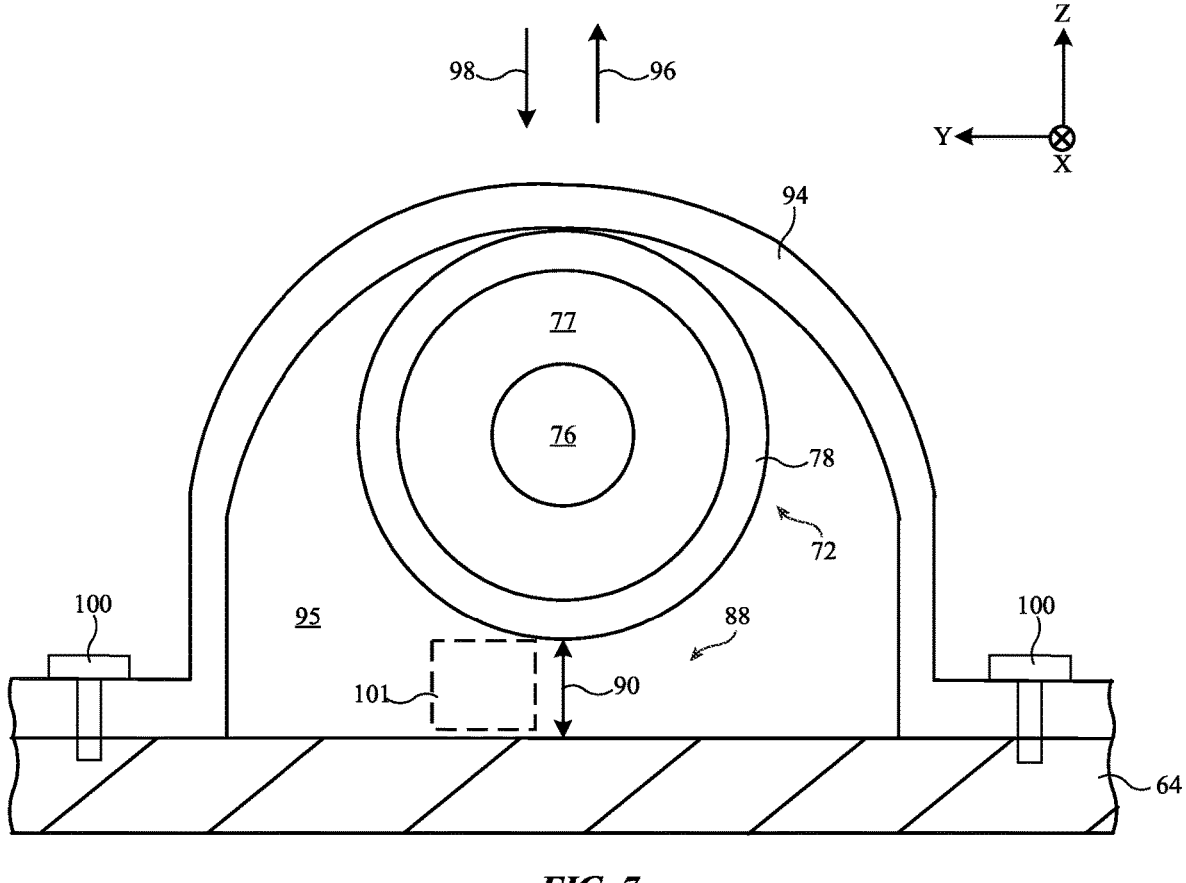
FIG. 7 is a cross-sectional side view of an illustrative retention structure for reliably maintaining a dielectric gap between a transmission line and an antenna ground in accordance with some embodiments.

FIG. 7 shows how a retention structure such as retention layer 94 (e.g., a cowling or a cover layer, or generally a retention structure) may overlap segment 80 of coaxial cable 72 and antenna ground 64. The structure and function of antenna ground 64 and coaxial cable 72 (e.g., segment 80, signal conductor 76, inner insulator 77, ground conductor 78, etc.) are similar to those already described in connection with FIGS. 3-5 and are not reiterated in detail to avoid obscuring the present embodiments in connection with FIG. 7.

As shown in FIG. 7, retention layer 94 may surround segment 80 of coaxial cable 72 around its peripheral sides (e.g., top, left, and right sides in the cross-sectional side perspective of FIG. 7). Retention layer 94 may define an opening or groove such as groove 95 (sometimes referred to as channel 95 or depression 95) configured to accommodate coaxial cable 72. In other words, groove 95 may have a shape that allows coaxial cable 72 to be received within retention layer 94. While retention layer 94 is depicted in the example of FIG. 7 to contact and surround ground conductor 78, this is merely illustrative. If desired, an outer insulating and protective sheath may surround ground conductor 78 and retention layer 94 may contact and surround the outer protective sheath (e.g., dielectric layer 79 in FIG. 5)

In order to avoid adverse impacts of retention layer 94 to coaxial cable 72 (e.g., parasitic effects, inadvertent impedance tuning, etc.), retention layer 94 may be formed from a material transparent to the radio-frequency radiation or functions (e.g., a material that has minimal impact on the conveyance of radio-frequency signals through coaxial cable 72, that has a minimal contribution to parasitic capacitances with respect to antenna ground 64 and/or ground conductor 78 and thereby does not affect the capacitive coupling between antenna ground 64 and ground conductor 78). In general, retention structure 94 may be formed from a material that provides a satisfactory structural function (e.g., holding coaxial cable 72 in place relative to antenna ground 64) without affecting desired operation of radio-frequency circuitry.

As examples, retention layer 94 may be formed form a dielectric material such as a plastic or other polymer, glass, ceramic, or other solid dielectric material. Configurations in which retention layer 94 is formed form plastic or polymer are sometimes described herein as an example.

In one illustrative arrangement, because of the topology of antenna ground 64 and/or the routing of coaxial cable 72 within device 10, when coaxial cable 72 is assembled into device 10 (e.g., connected to antenna 40), segment 80 in coaxial cable 72 may exhibit a natural bend in an upward direction 96 (e.g., +z direction). Retention structure 94 may apply a corresponding downward force in direction 98 (e.g., −z direction) across at least some of segment 80 on coaxial cable 72 to maintain distance 90 of gap 88. While retention layer 94 is shown in the example of FIG. 7 to contact coaxial cable 72 along the top surface of coaxial cable 72 (e.g., to apply forward in downward direction 98, thereby fixing the position of segment 80 along the dimension parallel to the z-axis), this is merely illustrative. If desired, retention layer 94 may confine coaxial cable 72 on the left and right sides (in the perspective of FIG. 7) of coaxial cable 72, thereby fixing the position of segment 80 along the dimension parallel to the y-axis. If desired, retention layer 94 may include portions between coaxial cable 72 and antenna ground 64 to (further) maintain distance 90.

Attachment structures such as screws 100 or other fasteners may hold and attach portions of retention layer 94 to antenna ground 64. In the example of FIG. 7, retention layer 94 may include two planar portions on opposing sides of the recessed (grooved) portion of retention layer 94 defining groove 95. Both planar portions may be attached to antenna ground 64 via screws 100. If desired, other attachment structures such as adhesive, clips, pins, etc. may be used to attach retention layer 94 to antenna ground 64. These attachment structures (e.g., screws 100) may include conductive material or non-conductive material such as dielectric material or other material transparent to radio-frequency radiation.

If desired, instead of or in additional to retention layer 94, adhesive such as adhesive 101 and/or other structures (e.g., solid spacer structures) may be provided between coaxial cable 72 and antenna ground 64 to hold coaxial cable 72 in place (relative to antenna ground 64) and/or to maintain distance 90 of gap 88.

Figure 8:
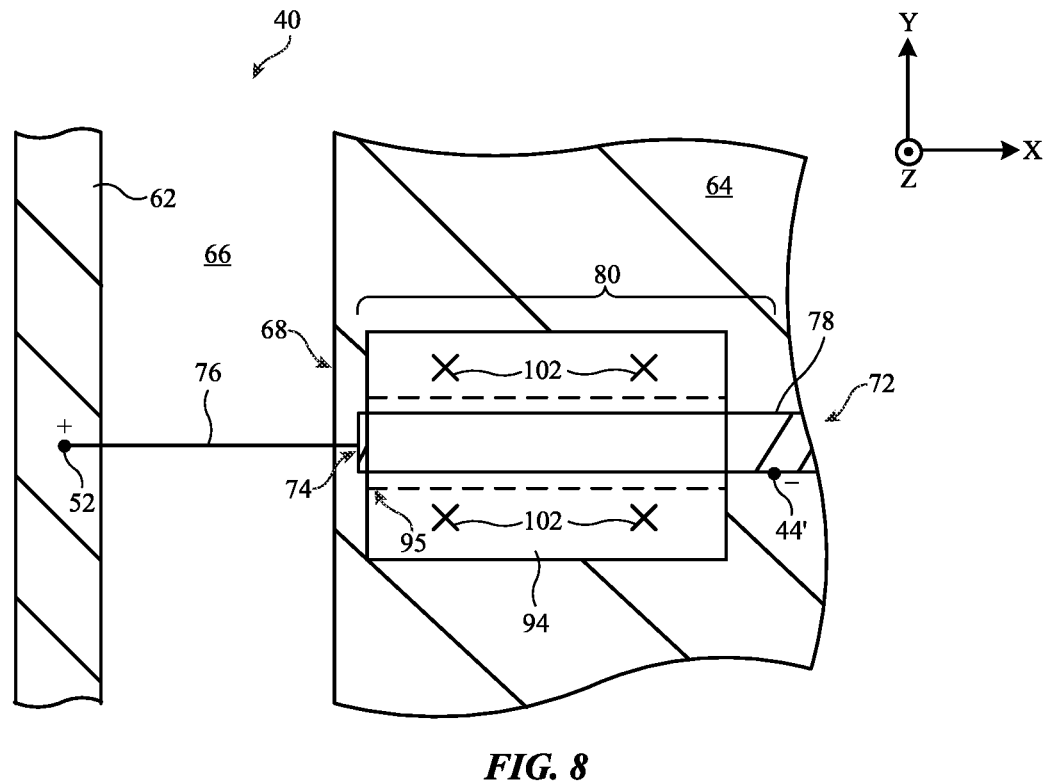
FIG. 8 is a plan view of a transmission line overlapped by an illustrative retention structure of the type shown in FIG. 7 in accordance with some embodiments.

FIG. 8 is a plan view of an illustrative radio-frequency transmission line having an ungrounded segment overlapped by a retention layer. In particular, FIG. 8 shows how a retention layer such as retention layer 94 may be incorporated into the type of wireless circuitry (e.g., the type of antenna, the type of transmission line, etc.) depicted in FIG. 4. The structure and function of antenna 40 (e.g., conductive structure 62, antenna ground 64, slot element 66, feed terminals 52 and 44', etc.) and coaxial cable 72 (e.g., signal conductor 76, ground conductor 78, etc.) are similar to those already described in connection with FIGS. 3-5 and are not reiterated in detail to avoid obscuring the present embodiments in connection with FIG. 8.

As shown in FIG. 8, retention layer 94 may cover at least a portion of segment 80 of coaxial cable 72. If desired, retention layer 94 may cover a curved portion of segment 80 or other non-linear features along segment 80 that are more conducive to upward bending (e.g., in the +z direction) and/or bending or movement in other directions. Retention layer 94 may maintain gap 88 particularly along this portion of segment 80.

In particular, groove 95 for accommodating coaxial cable 72 underneath retention layer 94 may run along the length of and follow the routing path of coaxial cable 72. Attachment mechanisms such as screws may be placed at locations 102 on opposing sides of coaxial cable 72 to attach retention layer 94 to antenna ground 64. In the example of FIG. 8, retention layer 94 may be attached to antenna ground at planar portions of retention layer 94 (e.g., extending parallel to the x-y plane). The two planar portions of retention layer 94 may be on opposing sides of the grooved portion of retention layer 94 holding coaxial cable 72.

Figure 9:
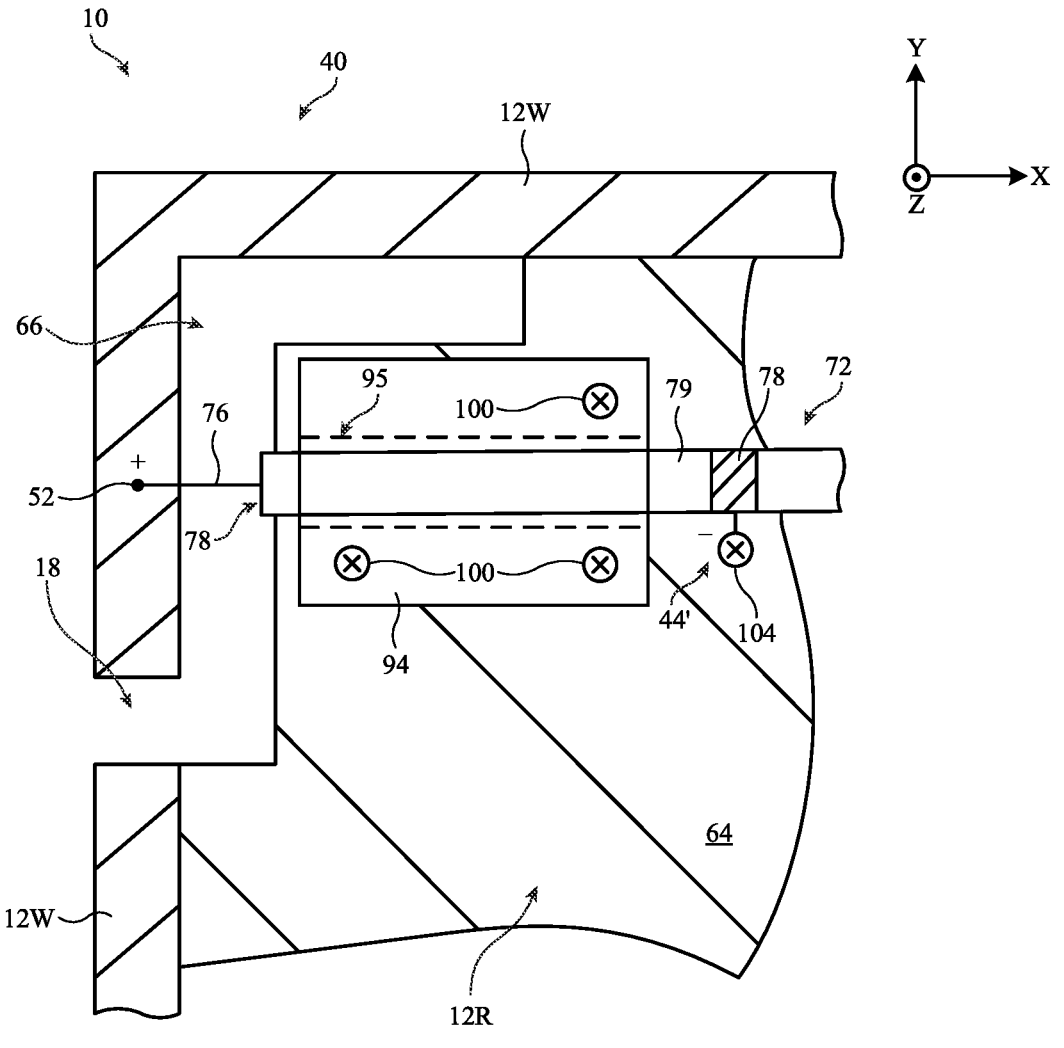
FIG. 9 is a plan view of a corner region of an illustrative electronic device having an antenna coupled to an illustrative transmission line with an ungrounded section in accordance with some embodiments.

FIG. 9 is a plan view of a corner region of an illustrative electronic device such as device 10 (FIGS. 1 and 2) having an antenna coupled to an illustrative coaxial cable with an ungrounded segment. The corner region illustrated in FIG. 9 may be one of the two corners in upper region 20 (FIG. 1), one of the two corners in lower region 22 (FIG. 1), or may be implemented at multiple corners of device 10. The structure and function of antenna 40 (e.g., antenna ground 64, slot element 66, feed terminals 52 and 44', etc.) coaxial cable 72 (e.g., signal conductor 76, ground conductor 78, etc.), retention layer 94 (e.g., groove 95, screws 100, etc.), and housing 12 (e.g., housing walls 12W and 12R) are similar to those already described in connection with FIGS. 1-8 and are not reiterated in detail to avoid obscuring the present embodiments in connection with FIG. 9.

As shown in FIG. 9, antenna 40 may include a slot antenna resonating element formed from slot element 66. Slot element 66 may have edges define by peripheral conductive housing structures 12W (e.g., one or more housing sidewalls of device 10 on top and left sides of device 10 in the perspective of FIG. 9) and antenna ground 64. Rear housing wall 12R may at least partly form antenna ground 64. Slot element 66 may have a meandering outline, e.g., have two linear portions extending parallel to the x-axis joined by a third linear portion extending parallel to the y-axis. Slot element 66 may have an open end at dielectric-filed gap 18 between segments of peripheral conductive housing structures 12W and an opposing closed end at antenna ground 64.

A radio-frequency transmission line such as coaxial cable 72 may be coupled across slot element 66. As shown in FIG. 9, coaxial cable 72 may be coupled to antenna feed terminals on opposing sides of slot element 66. Signal conductor 76 may be coupled to peripheral conductive housing structures 12W at positive antenna feed terminal 52 and may be coupled to antenna ground 64 (e.g., a portion of rear housing wall 12R) at ground antenna feed terminal 44'. Coaxial cable 72 may convey radio-frequency signals to and from antenna 40 (e.g., slot element 66). In particular, slot element 66 may have dimensions (e.g., a perimeter) that efficiently radiates (e.g., based on fundamental and/or harmonic modes, based on tuning components such as capacitor and/or inductors coupled across slot element 66, etc.) at one or more frequencies of the conveyed radio-frequency signals.

In the example of FIG. 9, coaxial cable may have an outer dielectric layer (e.g., a protective sheath) that covers ground conductor 78. At a location for making a terminal contact, a portion of ground conductor 78 may be exposed (e.g., uncovered by the outer dielectric layer). At this location, ground conductor 78 of coaxial cable 72 may be coupled to (e.g., electrically shorted to) antenna ground 64 via a grounding path that includes a conductive fastener such as conductive grounding screw 104 and a corresponding grounding ring coupled to ground conductor 78 screwed to contact antenna ground 64. Screw 104 may form the connection for ground antenna feed terminal 44'.

As described in connection with FIGS. 4-8, by providing a ground antenna feed terminal 44' connected to a portion of ground conductor 78 separated by a distance from end 74 of ground conductor 78, coaxial cable 72 may include an ungrounded segment (e.g., segment 80) of ground conductor 78 that is not actively grounded (e.g., only actively grounded at the exposed portion of ground conductor 78 connected to terminal 44'). The ground conductor 78 in this ungrounded segment may be separated from antenna ground 64 by a gap as measured along the dimension parallel to the z-axis (e.g., gap 88 in FIG. 7). The capacitive coupling between ground conductor 78 and antenna ground 64 enabled by this gap may form a matching component for coaxial cable 72 (e.g., serve as an equivalent to a transmission line tuning stub).

To hold coaxial cable 72 in place and maintain a consistent between gap between ground conductor 78 and antenna ground 64, retention layer 94 such as a plastic cowling may be placed over coaxial cable 72. Retention layer 94 may have a recess (e.g., groove 95) that accommodates coaxial cable 72. Retention layer 94 may be attached to antenna ground 64 (e.g., rear housing wall 12R) via screws 100 on opposing sides of coaxial cable 72.

While FIGS. 7-9 show the use of retention layer 94 as a retention mechanism for coaxial cable 72 relative to antenna ground 64, this is merely illustrative. If desired, adhesive or other attachment mechanisms may be used to hold coaxial cable 72 in place relative to antenna ground 64 and to provide the desired capacitive coupling between ground conductor 78 and antenna ground 64 without substantively interfering with radio-frequency operations.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
a conductive structure for an antenna;
an antenna ground for the antenna; and
a coaxial cable having a signal conductor coupled to the conductive structure at a positive antenna feed terminal and having a ground conductor coupled, at a location on the ground conductor, to the antenna ground at a ground antenna feed terminal, wherein the ground conductor includes a segment that is between the location and an end of the ground conductor, the segment between the location on the ground conductor and the end of the ground conductor is capacitively coupled to the antenna ground, a capacitive coupling between the segment between the location on the ground conductor and the end of the ground conductor and the antenna ground is configured to form an impedance matching component for the coaxial cable, the location is a grounding location on the ground conductor closest to the end of the ground conductor along a length of the ground conductor, and the segment is an ungrounded segment extending from the grounding location to the end of the ground conductor.

2. The electronic device of claim 1, wherein the coaxial cable is separated from the antenna ground via a gap that extends along the segment.

3. The electronic device of claim 2, wherein the end of the ground conductor is at an edge of the antenna ground facing the conductive structure.

4. The electronic device of claim 1, wherein the segment is between the location on the ground conductor and an additional location on the signal conductor at which the signal conductor is coupled to the conductive structure.

5. The electronic device of claim 1 further comprising:
a retention layer that overlaps the segment of the ground conductor and the antenna ground.

6. The electronic device of claim 5,
wherein the retention layer includes a groove in which the coaxial cable is disposed.

7. The electronic device of claim 6, wherein the retention layer is attached to the antenna ground on opposing sides of the groove.

8. The electronic device of claim 5, wherein the retention layer is configured to hold the coaxial cable in place to maintain a gap between the segment of the ground conductor and the antenna ground.

9. The electronic device of claim 5, wherein the retention layer is formed from a material that is transparent to radio-frequency radiation.

10. The electronic device of claim 9, wherein the retention layer comprises a plastic cowling.

11. The electronic device of claim 1 further comprising:
adhesive between the coaxial cable and the antenna ground and configured to hold the coaxial cable in place to maintain a gap between the segment of the ground conductor and the antenna ground.

12. The electronic device of claim 1, wherein the conductive structure and the antenna ground surround a slot element and the antenna comprises a slot antenna.

13. The electronic device of claim 12 further comprising:
a housing having a peripheral conductive sidewall and a rear housing wall, wherein the conductive structure is formed from the peripheral conductive sidewall and the antenna ground is formed from the rear housing wall.

14. An electronic device comprising:
a slot element having first and second opposing sides formed from conductive structures, wherein the conductive structures include an antenna ground on the second side of the slot element;
a coaxial cable coupled to the conductive structures across the slot element and having a ground conductor and a signal conductor, wherein the coaxial cable has a segment along which the ground conductor is capacitively coupled to the antenna ground to provide impedance matching for the coaxial cable, the segment is between a first location at which the ground conductor is coupled to a ground antenna feed terminal of the slot element and a second location at which the signal conductor is coupled to a positive antenna feed terminal of the slot element, the first location is a grounding location for the ground conductor closest to an end of the ground conductor along a length of the coaxial cable, and the segment capacitively coupled to the antenna ground extends from the grounding location closest to the end of the ground conductor to the end of the ground conductor; and
a dielectric retention layer that overlaps the segment of the coaxial cable and holds the segment of the coaxial cable in place with respect to the antenna ground.

15. The electronic device of claim 14, wherein the dielectric retention layer includes a groove that extends along a length of the segment of the coaxial cable.

16. The electronic device of claim 15, wherein the dielectric retention layer is attached to the antenna ground on opposing sides of the groove.

17. The electronic device of claim 16 further comprising:
screws that attach the retention layer to the antenna ground on the opposing sides of the groove.

18. The electronic device of claim 14, wherein the segment of the coaxial cable comprises an ungrounded portion of the ground conductor.

19. An electronic device comprising:

peripheral conductive housing structures having first and second segments separated by a dielectric-filled gap;

an antenna ground separated from the peripheral conductive housing structures by a slot having an open end at the dielectric-filled gap;

a radio-frequency transmission line having a signal conductor coupled to a positive antenna feed terminal at the first segment and having a ground conductor coupled to a ground antenna feed terminal at the antenna ground, wherein the radio-frequency transmission line has a segment separated from the antenna ground by a gap to form an impedance matching element using the gap, the antenna ground, and a portion of the ground conductor along the segment, the portion of the ground conductor is between a location at which the ground conductor is coupled to the ground antenna feed terminal and an end of the ground conductor, the location is a grounding location for the ground conductor closest to the end of the ground conductor along a length of the ground conductor, and the portion of the ground conductor extends beyond the grounding location toward the end of the ground conductor; and a dielectric retention layer that overlaps the segment of the radio-frequency transmission line and the antenna ground and that maintains the gap between the segment of the radio-frequency transmission line and the antenna ground.

20. The electronic device of claim 19, wherein the radio-frequency transmission line comprises a coaxial cable, the signal conductor is surrounded by the ground conductor, and the ground conductor is capacitively coupled to the antenna ground via the gap.

* * * * *